US006931038B2

(12) United States Patent
Mazed (10) Patent No.: US 6,931,038 B2
(45) Date of Patent: Aug. 16, 2005

(54) WAVELENGTH LOCKED SEMICONDUCTOR LASER MODULE

(75) Inventor: Mohammad A. Mazed, Chino Hills, CA (US)

(73) Assignee: Technology Asset Trust, Placentia, CA (US)

( * ) Notice: Subject to any disclaimer, the term of this patent is extended or adjusted under 35 U.S.C. 154(b) by 0 days.

(21) Appl. No.: 10/192,379

(22) Filed: Jul. 8, 2002

(65) Prior Publication Data

US 2004/0004980 A1 Jan. 8, 2004

(51) Int. Cl.$^7$ ................................................. H01S 3/13
(52) U.S. Cl. .............................. 372/32; 372/20; 372/36; 372/92
(58) Field of Search ............................. 372/18, 34–36, 372/20, 32, 92

(56) References Cited

U.S. PATENT DOCUMENTS

| | | | | |
|---|---|---|---|---|
| 5,438,579 A | * | 8/1995 | Eda et al. ..................... 372/34 |
| 6,125,200 A | * | 9/2000 | Warnock ..................... 382/164 |
| 6,243,403 B1 | * | 6/2001 | Broutin et al. ................ 372/32 |
| 6,366,597 B1 | | 4/2002 | Yuen et al. .................... 372/96 |
| 6,400,737 B1 | * | 6/2002 | Broutin et al. ................ 372/20 |
| 6,516,010 B1 | * | 2/2003 | Broutin et al. ........... 372/29.01 |
| 6,597,712 B2 | * | 7/2003 | Tatsuno et al. ............... 372/32 |
| 6,611,341 B2 | * | 8/2003 | May ........................... 356/519 |

* cited by examiner

*Primary Examiner*—David Porta
*Assistant Examiner*—Davienne Monbleau
(74) *Attorney, Agent, or Firm*—John W. Eldredge; Myers Dawes Andras & Sherman LLP (57) ABSTRACT

A wavelength locked semiconductor laser module has at least one of semiconductor laser of the laser arrays and a heater and/or cooler configured to vary a temperature of the semiconductor laser(s). A phase shifted wavelength locker is configured with wavelength locker temperature sensor and microprocessor to control of the wavelength of the semiconductor laser of the laser arrays instantaneously with absolute precision.

19 Claims, 4 Drawing Sheets

WAVELENGTH LOCKED SEMICONDUCTOR LASER MODULE

FIELD OF THE INVENTION

The present invention relates generally to semiconductor lasers suitable for use in fiber optic communications. The present invention relates particularly to a wavelength locked semiconductor laser or laser array module preferably consisting of distributed feedback (DFB) or distributed Bragg reflector (DBR) semiconductor lasers or laser arrays.

BACKGROUND OF THE INVENTION

Fiber optic communication systems, where light is modulated and encoded (with desired information, such as voice, video or data) are transmitted via optical fibers.

One advantage of such optical fiber communication systems is the ability to transmit large amounts of information over a single optical fiber. However, as the number of users of such systems increases and as the quantity of data to be transmitted by each user also increases, it is necessary for a fiber optic communication system to accommodate the transmission of ever-greater quantities of information.

In some instances, it may be cost effective to deploy additional optical fibers, so as to increase the capacity of the fiber optic communication system. However, in many instances, it is extremely expensive to deploy new optical fibers and it is preferable to enhance the efficiency of channel utilization of enormous inherent bandwidth of the optical fibers in order to increase the quantity of information transmitted via a single optical fiber.

In dense wavelength division multiplexing (DWDM) systems, light having a plurality of different wavelengths is used. Each wavelength of light is independently modulated, so as to define a channel, which may be used to transmit information independently with respect to all other channels on the same optical fiber. Of course, the more independent channels which can be transmitted via a single optical fiber, the more the capacity of that optical fiber is to transmit information.

In order to increase the number of channels over which information can be transmitted via a single optical fiber, it is necessary to precisely control the wavelength of each channel. The wavelength demultiplexer and receiver of a fiber optic communication system can only demodulate and detect a channel efficiently when the wavelength of that channel is within a very narrow and predefined range. If the wavelength of the channel is outside of the predetermined wavelength range of the receiver, then the channel may be completely unusable.

Also, undesirable interference results when the wavelength of one channel drifts too close to the wavelength of an adjacent channel. The rate at which data is communicated in a channel must be decreased substantially in order to compensate for such interference. Thus, such interference inherently limits the spacing between channels and rate of cumulative transmission.

In view of the foregoing, it is desirable to precisely control the wavelength of each channel of an optical communication system, such as a dense wavelength division multiplexing (DWDM) fiber optic communication system. The market for precisely controlled wavelength locked laser modules is expected to be $0.5 billion dollars in 2010.

It is also desirable to package a semiconductor laser or laser array capable of providing a wide range of wavelengths along with a wavelength locker which assures desired choice of wavelength with stability over lifetime of a selected wavelength, within a contemporary hermetically sealed butterfly package.

BRIEF SUMMARY OF THE INVENTION

The present invention specifically addresses and alleviates the above-mentioned deficiencies associated with the prior art. More particularly, one aspect of the present invention comprises a wavelength locked laser module comprising at least one laser, a heater and/or cooler TEC (peltier thermoelectric cooler) configured to vary or tune a temperature of the semiconductor laser(s) or laser array, a wavelength locker configured to monitor a wavelength of an output of the laser(s), a temperature monitor configured to monitor a temperature of the wavelength monitor and a temperature monitor configured to monitor a temperature of the laser monitor.

Another aspect of the present invention comprises at least one semiconductor laser or laser array, a beam splitter configured to receive light from the semiconductor laser or laser array and a wavelength locker configured to receive light from the beam splitter. The wavelength locker is disposed behind the semiconductor laser or laser array to facilitate compact space savings pin-compatible low-cost packaging of the wavelength locked laser module, such as in a contemporary hermetically sealed butterfly semiconductor laser or laser array package.

These, as well as other advantages of the present invention, will be more apparent from the following description and drawings. It is understood that changes in the specific structure shown and described may be made within the scope of the claims without departing from the spirit of the present invention.

BRIEF DESCRIPTION OF THE DRAWINGS

The present invention will be more fully understood when considered with respect to the following detailed description, appended claims and accompanying drawings, wherein:

DETAILED DESCRIPTION OF THE INVENTION

The detailed description set forth below in connection with the appended drawings is intended as a description of the presently preferred embodiment of the invention, and is not intended to represent the only form in which present invention may be constructed or utilized. The detailed description sets forth the construction and functions of the invention, as well as a sequence of steps for operating the invention in connection with the illustrated embodiment. It is to be understood, however, that the same or equivalent functions may be accomplished by different embodiments that are also intended to be encompassed within the spirit and scope of the invention.

The wavelength locked semiconductor laser or laser array module of the present invention provides at least one semiconductor laser or laser array for use in fiber optic communication systems which operates over a comparatively wide range of wavelengths, which is sufficiently stable in wavelength for use in dense wavelength division multiplexing (DWDM) applications, and which fits within a small footprint hermetically sealed butterfly semiconductor laser or laser array package, such as those commonly used in such applications.

According to one aspect of the present invention, the wavelength locked semiconductor laser or laser array module comprises at least one semiconductor laser of the laser array, a heater and/or cooler configured to vary or tune a temperature of the laser(s), a wavelength monitor configured to monitor a wavelength of an output of the laser(s), and a temperature monitor configured to monitor a temperature of the wavelength monitor. Monitoring a temperature of the wavelength locker facilitates correction of the responses of the wavelength locker thereof, which is necessitated by changes in the length thereof due to temperature changes caused by the heating and/or cooling of semiconductor laser or laser array as discussed in detail below.

A semiconductor laser or laser array preferably comprised temperature or current or temperature and current tuned semiconductor diode laser(s), such as distributed feedback (DFB) laser(s) or distributed Bragg reflector (DBR) lasers. Those skilled in the art will appreciate that various other types of tunable or selectable lasers are likewise suitable.

Although only a single semiconductor laser or laser array is preferably utilized so as to facilitate operation of the wavelength locked semiconductor laser or laser array of wavelengths, a desired wavelength may be provided by selecting one semiconductor laser of the laser array module over a comparatively wide range of wavelengths and temperatures. Thus, each semiconductor laser of the semiconductor laser array preferably has a contiguous, optionally overlapping, range which is capable of providing that wavelength, activating the selected laser and then tuning the selected laser to the desired wavelength.

The semiconductor laser array preferably has a range of at least 15 nanometers. Indeed, the wavelength locked laser module of the present invention may be configured so as to cover portions of different wavelength ranges in S, C and L band of the optical communication. Indeed, the semiconductor laser or laser array may need not cover contiguous portions of a wavelength range, but may rather cover non-contiguous portions, such that a plurality of different wavelength ranges is defined thereby.

According to the preferred embodiment of the present invention, a collimating lens is configured to collimate light from the semiconductor laser or laser array. According to one aspect of the present invention, the collimating lens is configured such that light from the semiconductor laser or laser array is incident thereupon at an approximately orthogonal angle. According to another aspect of the present invention, semiconductor laser or laser array chip is configured or mounted such that light exit at a non-orthogonal angle to the laser facet, so as to reduce back reflection of light from the semiconductor laser or laser array facet to the semiconductor laser cavities.

The wavelength locker preferably comprises an etalon, preferably a multiple-cavity phase-shifted etalon, such as a phase-shifted etalon with three 120-degree phase shifts. Thus, the etalon used in the present invention may have any desired number of cavities with specific phase angle relationships with respect to each other.

The heater and/or cooler preferably comprise a Peltier thermoelectric cooler (TEC). The heater and/or cooler must be capable of inducing temperature changes into the laser(s), which are sufficient to cause the semiconductor lasers to tune or operate at desired wavelengths.

The temperature monitor comprises a thermistor. Various other types of temperature monitors, such as thermocouples and second wavelength locker TEC are also useful along with a thermistor.

According to one aspect of the present invention, light transmitted from a common end of the semiconductor laser or laser array is used for both wavelength locking and single mode fiber coupling. That is, light is transmitted from only one end of the semiconductor laser or laser array and the light is split, preferably such that 90% of the light is provided to a fiber for single mode fiber coupling, while the remaining 10% light is used to lock the wavelength at a desired precise value.

According to another aspect of the present invention, the wavelength locker is disposed behind the semiconductor laser or laser array; so as to facilitate more efficient space saving packaging of the wavelength locked semiconductor laser or laser array system. As those skilled in the art will appreciate, it is desirable to package the wavelength locked semiconductor laser or laser array system of the present invention in a contemporary hermetically sealed butterfly semiconductor laser or laser array package, such as those commonly used in the art.

Thus, the semiconductor laser or laser array, the heater and/or cooler, the wavelength locker and the temperature monitor are preferably disposed within a common housing. Alternatively, the semiconductor laser or laser array, the heater and/or cooler, the wavelength locker and the temperature monitor may be packaged in any other desired manner.

The first mirror is preferably configured to transmit 90% light from the lasers and then to provide 10% light to second mirror in the upward vertical direction. A second mirror reflects this 10% light in a backward direction, so as to be incident upon a multiple-cavity phase-shifted etalon in a parallel way. The multiple-cavity phase-shifted etalon is disposed behind the semiconductor laser or laser array. By disposing the multiple-cavity phase shifted etalon behind the semiconductor laser or laser array, a folded configuration of the wavelength locked semiconductor laser or laser array laser system of the present invention is defined in a very compact space saving pin-compatible location for longer etalon sizes at 12.5 GHz or lower channel spacing.

Semiconductor laser or laser array light from the collimator is transmitted through a first isolator, so as to inhibit back reflection to semiconductor laser or laser array. Light from the second mirror is transmitted through a second isolator, anti-reflection coated polarization beam splitter and anti-reflection coated quarter wave plate so as to further inhibit back reflection to semiconductor laser or laser array.

The beam splitter preferably comprises an anti-reflection coated polarizing beam splitter, so as to further mitigate undesirable back reflection of light to the semiconductor laser or laser array utilizing both anti-reflection coated polarizing beam splitter and anti-reflection coated quarter wave plate.

According to the preferred embodiment of the present invention, the light transmitted from the front end of the semiconductor laser or laser array is reflected upwardly and then is reflected backwardly to a multiple-cavity phase shifted etalon via second isolator, polarizing beam splitter and quarter wave plate. They are all disposed behind the semiconductor laser or laser array, so as to facilitate more efficient spacing saving packaging of the wavelength locked semiconductor laser or laser array module.

According to one aspect of the present invention, a microprocessor or digital signal processor (DSP) is configured to control the wavelength of at least one semiconductor laser (preferably of an array of semiconductor lasers) in response to a wavelength selection (such as that made by a user, the same microprocessor, another microprocessor, as any other device). The microprocessor uses the monitored temperature and electrical responses of the multiple-cavity phase-shifted etalon and original semiconductor laser temperature vs. semiconductor laser wavelength look up table to determine the wavelength of light being monitored or locked thereby and provides a control signal to the TEC so as to control the wavelength of the selected semiconductor laser or laser array.

Figure 1:
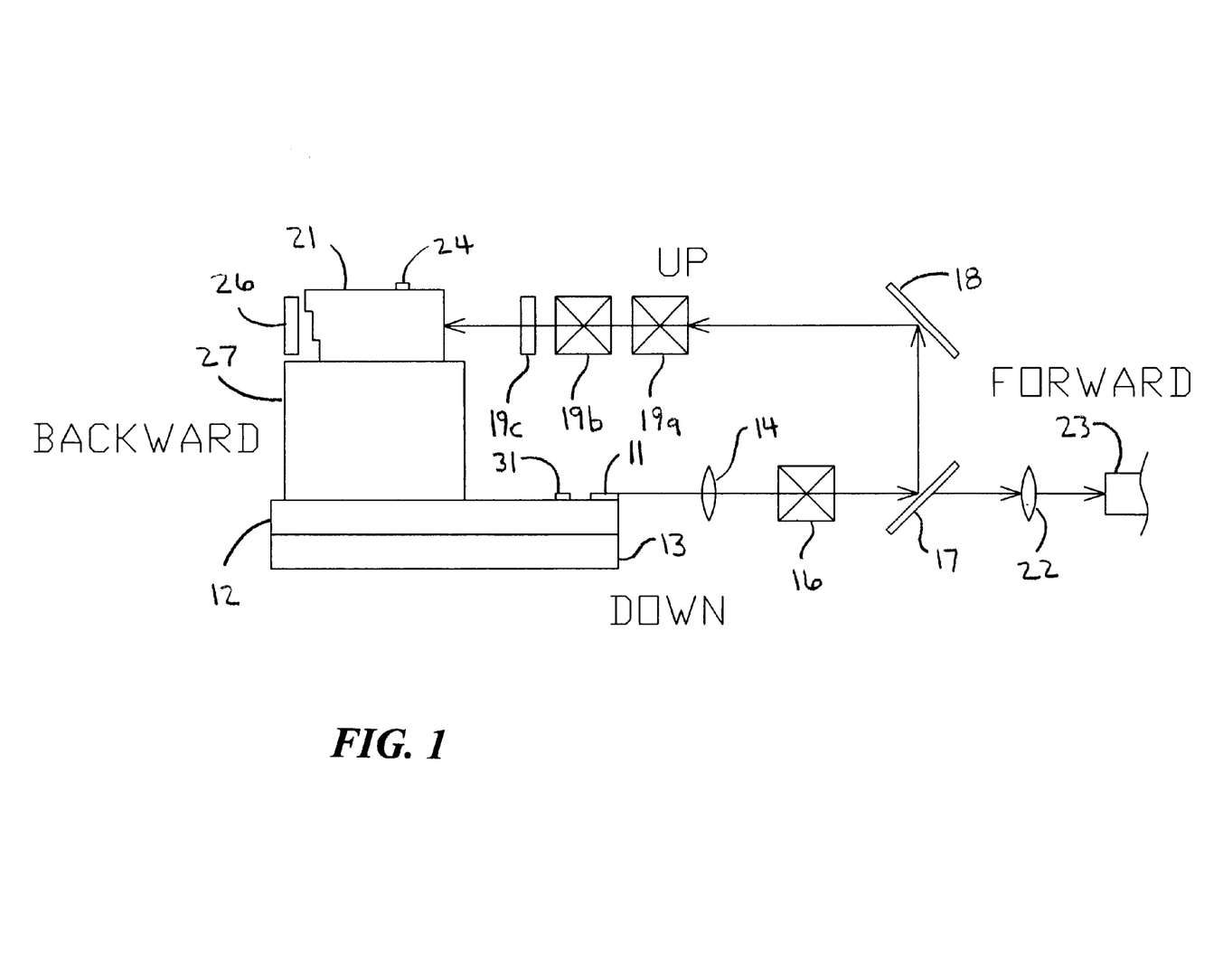
FIG. 1 is a semi-schematic diagram showing a first configuration of a wavelength locked laser module wherein a collimating lens is configured such that light from the semiconductor laser or laser array is incident thereupon approximately orthogonally.

Referring now to FIG. 1, according to one aspect of the present invention, at least one laser, preferably a semiconductor laser array 11 of semiconductor diode lasers, such as distributed feedback (DFB) or distributed Bragg reflection (DBR) lasers, is formed upon a semiconductor laser substrate 12 utilizing contemporary manufacturing methodology. The semiconductor laser substrate 12 is in close proximity to, preferably intimately attach to, a heater and/or cooler, such as thermoelectric cooler (TEC) 13.

The lasers of the laser array 11 may optionally comprise vertical cavity surface emitting lasers (VCESELs), as disclosed in U.S. Pat. No. 6,366,597, issued on Apr. 2, 2002 to Yuen et al. and entitled LATTICE-RELAXED VERTICAL OPTICAL CAVITIES, the entire contents of which is hereby expressly incorporated by reference.

A TEC is one example of a temperature varying device which may be used to heat and/or cool the semiconductor laser substrate 12, and consequently the semiconductor laser(s) or the semiconductor laser array 11, so as to vary an output wavelength therefrom.

Light from the semiconductor laser or laser array 11 is collimated by collimating lens 14, from which the light is transmitted to first optical isolator 16.

The first optical isolator 16 inhibits back reflection of light into the semiconductor laser or laser array 11. As those skilled in the art will appreciate, back reflection of light into the semiconductor laser or laser array 11 is undesirable for wavelength stability and digital modulation, since such back reflection typically undesirably affects operation of the semiconductor lasers or laser array 11.

Light from the optical isolator 16 is transmitted to a splitter 17, which functions as a first mirror for one component of the split light. Thus, one component of the split light is reflected upwardly vertically to second mirror 18, from which the light is reflected backwardly to optional optical isolator 19. Light from the second optical isolator 19 is transmitted to a wavelength monitor, such as a wavelength monitor comprising one or more etalons, or preferably, comprising a single multiple-cavity etalon 21. The multiple-cavity phase shifted etalon 21 preferably comprises three cavities with specific phase shifts or delays, so as to extend the range thereof, as discussed in detail in conjunction with FIGS. 3 and 4 below. The multiple-cavity etalon 21 design consists of a phase delay of 120-degree angle relative to each phase shift.

The collimating lenses of both fast axis and slow axis are preferably configured so as to provide an almost circular collimated light beam, which has a cross-sectional energy density such that each section of the multiple-cavity phase shifted etalon 21 receives approximately the same amount of light, so as to secure reliable wavelength locking operation thereof. Thus, for each cavity or section of three-cavity phase shifted etalon should receive approximately one-third of the intensity of the incoming beam from semiconductor laser or laser array 11.

The beam splitter 17 is preferably configured such that most of the light incident thereupon is transmitted therethrough to an external (outside of the package) focusing lens 22, from which the light is transmitted to the end of an optical fiber 23, such as for use via a focusing lens in a semiconductor laser or laser array laser module.

Typically, the focusing lens 22 and the end of the optical fiber 23 will be packaged separately from the remaining components of FIG. 1, which are typically packaged together.

Preferably, the orientation of the beam splitter 17 is adjustable and movable in six axes, at least during assembly of the wavelength locked laser system, so as to enhance ease of optical alignment of light provided to the multiple-cavity phase shifted etalon 21. For example, fine tiny jewelers set screws may be utilized to vary the orientation of the beam splitter 17 accordingly to well known mechanical principles. Preferably, such setscrews are soldered or laser welded in place and/or the beam splitter 17 is soldered or laser welded in place after any desired adjustments to the orientation of the beam splitter 17 are made, so as to assure that such orientation of the beam splitter 17 does not vary during use.

The mirror 18 is preferably similarly adjustable and is preferably also soldered or laser welded into place after alignment.

A temperature sensor 24 is configured to monitor a temperature of the multiple-cavity phase shifted etalon 21, and is preferably in intimate thermal contact therewith.

Multi-section photo-detector or photo-detector arrays are contained within photodetector assembly 26, for measuring the wavelength of light transmitted to the multiple-cavity phase shifted etalon 21, according to well-known principles.

Summation of optical or electrical responses of multiple-cavity phase shifted etalon 21 shall produce proportional output power of the semiconductor laser or laser arrays with 10% variation of absolute out power value across of the entire wavelength span.

The multiple-cavity phase shifted etalon 21 is mounted to etalon support 27, and is preferably in intimate thermal contact therewith. Similarly, etalon support 27 is preferably in intimate thermal contact with the semiconductor laser substrate 12. It is desired that temperature changes of the semiconductor laser or laser array substrate 12 (and consequently of the semiconductor laser or laser array 11, as well)

are conducted through the support 27 to the multiple-cavity phase shifted etalon 21 as quickly as possible and that the semiconductor laser or laser array 11 and the multiple-cavity phase shifted etalon 21 reach thermal equilibrium in response to temperature changes induced by the TEC 13 as quickly as possible.

The speed with which the semiconductor laser or laser array 11 and the multiple-cavity phase shifted etalon 21 reach thermal equilibrium in response to temperature changes induced by the TEC 13 is directly related to the speed at which a desired wavelength output from the wavelength locked laser module of the present invention can be provided. That is, the faster such thermal equilibrium is achieved, the faster a desired wavelength can be tuned and stabilized. The rate at which such thermal equilibrium is achieved is dependent, to a large degree, upon the thermal conductivity of the etalon material; etalon support 27 and feedback gain of TEC 13. Therefore, it is desired that the etalon support 27 have very high thermal conductivity without unnecessary thermal and/or mechanical stress. The etalon support 27 is preferably comprised of metal, such as copper or gold, or aluminum or diamond, or aluminum nitride or boron nitride or silicon carbide or beryllium oxide or silicon may similarly be utilized.

While similar wavelength measurement results can be achieved via the use of a plurality, e.g., three completely separate phase shifted etalons, it must be appreciated that the goal of one aspect of the present invention is to minimize the volume of the assembly, so as to facilitate desired spacing packaging of 100 GHz etalon to relatively long 12.5 GHz etalon thereof within a contemporary hermetically sealed butterfly semiconductor laser or laser array package. Therefore, a single multiple-cavity phase shifted etalon 21 is preferred over plural separate discrete single-cavity stepped etalons.

Figure 5:
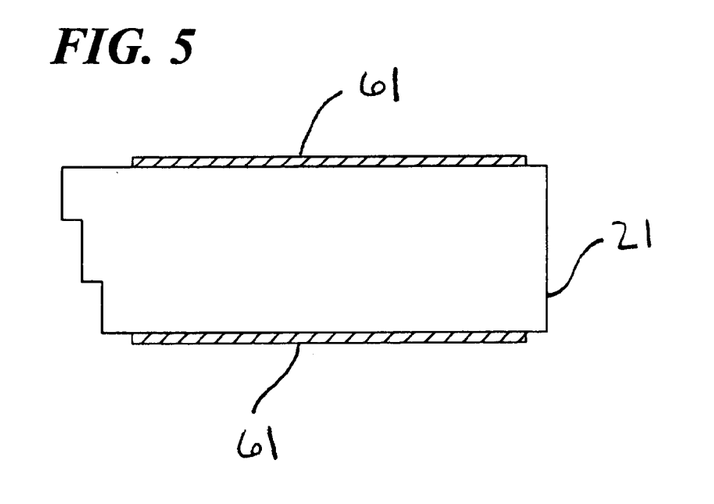
FIG. 5 is a side view, partially in cross-section, of a three-cavity phase shifted etalon having a heat conductive jacket formed thereto.
Figure 6:
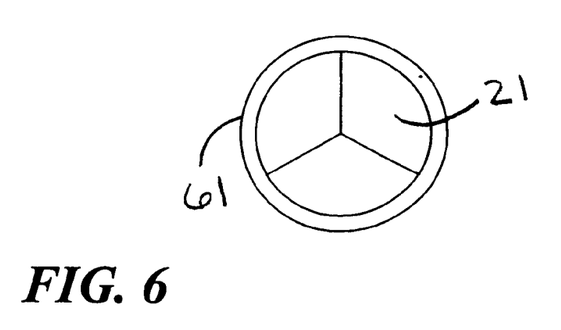
FIG. 6 is an end view of the three-cavity phase shifted etalon of FIG. 5.

Referring now to FIGS. 5 and 6, a jacket 61 may optionally be used so as to enhance the speed with which the multiple-cavity phase shifted etalon 21 reaches thermal equilibrium without thermal gradient after a change in temperature caused by the TEC 13. For example, a metal sleeve or other structure may be formed so as to substantially cover all sides of the multiple-cavity phase shifted etalon 21, so as to conduct heat there throughout and reduce thermal gradient between bottom and top of multiple-cavity phase shifted etalon 21.

Etalons typically generally comprise fused silica, which is a comparatively very poor thermal conductor. The choice of thermally conducting silicon or sapphire as etalon material is also a possibility. Contemporary fused silica etalons tend to reach thermal equilibrium at an undesirably slow rate, thereby limiting the speed of thermal equilibrium with which a desired wavelength can be provided from the semiconductor laser or laser array 11. By forming a metal jacket 61 in intimate thermal contact with the multiple-cavity phase-shifted etalon 21, and preferably in intimate thermal contact with the etalon support 27, as well, the speed with which the multiple-cavity etalon 21 reaches thermal equilibrium after a temperature change effected by the TEC 13 is substantially enhanced.

Shrink-fitting a tubular metal structure over a multiple-cavity etalon 21 may form the jacket 61. The jacket 61 may also be formed to the multiple-cavity etalon 21 by any other desired means, such as via metal coating.

Alternatively, as those skilled in the art will appreciate, various other thermally conductive structures may be utilized so as to desirably affect the rate at which thermal equilibrium of the multiple-cavity etalon 21 is reached. For example, rather than a jacket 61 which completely encircles the multiple-cavity phase sifted etalon 21, a frame, strips, or any other metal or ceramic structure which enhances the rate at which such thermal equilibrium is reached may be utilized.

According to the preferred embodiment of the present invention, epoxy less construction is achieved by utilizing soft eutectic solder (such as indium tin) to bond the nickel—gold plated optical components of the present invention to one another and into the package. For example, solder is preferably used to attach the multiple-cavity phase shifted etalon 21 to the etalon support 27. Thus, the need to epoxy for bonding such optical components together is completely eliminated—thus an epoxy less wavelength locker laser module is realized.

Figure 7:
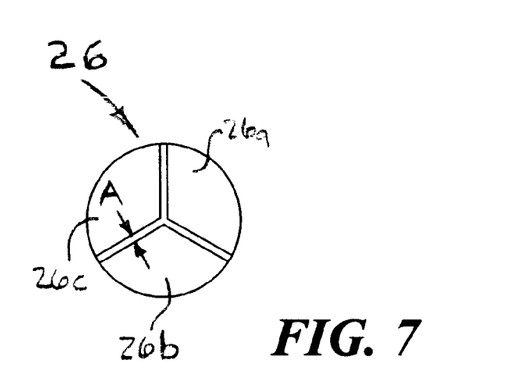
FIG. 7 is an end view of a three-element detector configured for use with the three-cavity phase shifted etalon of FIG. 5.

Referring now FIG. 7, an end view of the detector 26 of FIG. 1 is shown. According to the preferred embodiment of the present invention, the detector 26 comprises a 3-element detector having 3 individual detector element sensors 26a, 26b and 26c. Thus each detector element 26a–26c corresponds accurately to one of the three cavities of the multiple cavity phase shifts of etalon. Preferably, each detector element 26a–26c is separated from each other detector element 26a–26c by a spacing Dimension A of approximately 10 (ten) micron so as to reduce undesirable optical crosstalk between the detector elements 26a–26c.

Having described the structure of the wavelength locked semiconductor laser or laser array module 10 of the present invention, it may be beneficial to describe the operation thereof in further detail. One of the individual semiconductor laser or laser array 11 is selected, so as to provide a desired output wavelength from the semiconductor laser or laser array 11.

Preferably, the individual semiconductor laser or laser array 11 have contiguous, optionally overlapping, wavelength ranges, such that any desired wavelength within an overall wavelength range of the semiconductor laser or laser array 11 can be provided.

After selecting the desired individual semiconductor laser or laser array 11, a light output of the selected semiconductor laser or laser array is collimated by collimating lens 14 and is directed backwardly by cooperation of the splitter 17 and second mirror 18. The first isolator 16 and, optionally, the second optical isolator 19a, anti-reflection coated polarizing beam splitter, 19b and anti-reflection coated quarter wave plate 19c inhibit undesirably back reflections of light to the laser or laser array 11. Preferably, most of the light incident upon the beam splitter 17 is transmitted therethrough to the end of the optical fiber 23. For example, approximately 90% of the light incident upon the beam splitter 17 may be transmitted therethrough, while approximately 10% percent of the light incident upon beam splitter 17 is reflected upwardly.

Light from the selected semiconductor laser or laser array 11 is thus provided to the multiple-cavity phase shifted etalon 21, which in cooperation with the multiple-section photodetector array assembly 26, measures the optical responses thereof, according to well-known principles.

When the measured value of the wavelength of light provided to the multiple-cavity phase shifted etalon 21 is different from the desired wavelength, then the temperature of the selected semiconductor laser or laser array 11, typically as well as a the temperature of all of the other semiconductor laser of the laser array 11, is varied in a manner which causes the wavelength of light from the selected semiconductor laser to be closer to the desired wavelength. That is, if heating the semiconductor laser 11 will cause the wavelength of light output therefrom to move closer to the desired wavelength, then the TEC 13 is caused to heat the semiconductor laser substrate 12. Conversely, if cooling the semiconductor laser or laser array 11 will cause the wavelength of light output therefrom to be closer to the desired wavelength, then the TEC 13 is caused to cool the semiconductor laser substrate 12.

As the TEC 13 causes the wavelength to vary or tune, the wavelength of the selected semiconductor laser is monitored by cooperation of the multiple-cavity phase shifted etalon 21 and the photodetector assembly 26. Further changes in the temperature of the semiconductor laser or laser array (and consequently of the output wavelength thereof) are made until the wavelength from the selected semiconductor laser or laser array is acceptably close to the desired wavelength. Preferably, such closed-loop feedback control is facilitated by an external (to the packaged items shown in FIG. 1) microprocessor. Alternatively, such closed-loop feedback control is facilitated by dedicated circuitry or by any other desired means.

It is important to note that as the TEC 13 varies the temperature of the semiconductor laser or laser array substrate 12, corresponding temperature changes are also conducted, preferably rapidly, to the multiple-cavity phase shifted etalon 21, and thereby effect the wavelength measuring performed thereby. As those skilled in the art will appreciate, such temperature changes alter the physical dimensions of the cavities of the multiple-cavity phase shifted etalon 21, thereby likewise altering the resonant frequencies thereof.

The microprocessor accesses a lookup table, which provides wavelengths, which correspond to outputs from the photodetector assembly 26 at different temperatures. Alternatively, the microprocessor may utilize a formula or equation or any other desired means to determine such wavelengths of semiconductor laser or laser array.

The temperature of the semiconductor laser or laser array substrate may also be monitored by a temperature sensor 31, so as to better facilitate such control of the wavelength of the output of a selected laser of the semiconductor laser or laser array 11. For example, it may be determined (such as via experimentation) that a particular temperature of the semiconductor laser or laser array 12 corresponds to a particular wavelength output of a particular semiconductor laser of the laser array 11. The microprocessor may then be utilized to change the temperature of the semiconductor laser or laser array substrate 12, as sensed by the temperature sensor 31, to a temperature that results in the desired wavelength. The temperature sensor 31 may optionally be used to control the rate at which temperature changes to the semiconductor laser or laser array substrate 12 occur.

Use of the temperature sensor 31 may thus, for example, tend to mitigate overdriving of the TEC 13, and the consequent overshooting of the desired temperature of the laser array 11. Thus, when the desired temperature of the semiconductor laser or laser array 11 is substantially different from the actual temperature thereof, as determined by the temperature sensor 31, then the TEC 13 may be driven (such as by providing more current thereto) in a manner, which more rapidly effects the desired temperature change of the semiconductor laser or laser array 11. That is, in some instances, it may be desirable to cause the TEC 13 to provide more heating or cooling than is necessary to achieve the desired temperature of the semiconductor laser or laser array 11, so as to cause the semiconductor laser or laser array 11 to reach the desired temperature more quickly, and then reduce the rate at which heating or cooling from the TEC 13 occurs, so as to maintain the desired temperature of the semiconductor laser or laser array 11 semiconductor laser or laser array 11. Moreover, use of the temperature monitor 31 may thus facilitate enhanced control of the rate at which the TEC 13, thus affecting the rate at which desirable changes in wavelength are provided, effects temperature changes of the semiconductor laser or laser array 11.

Figure 4:
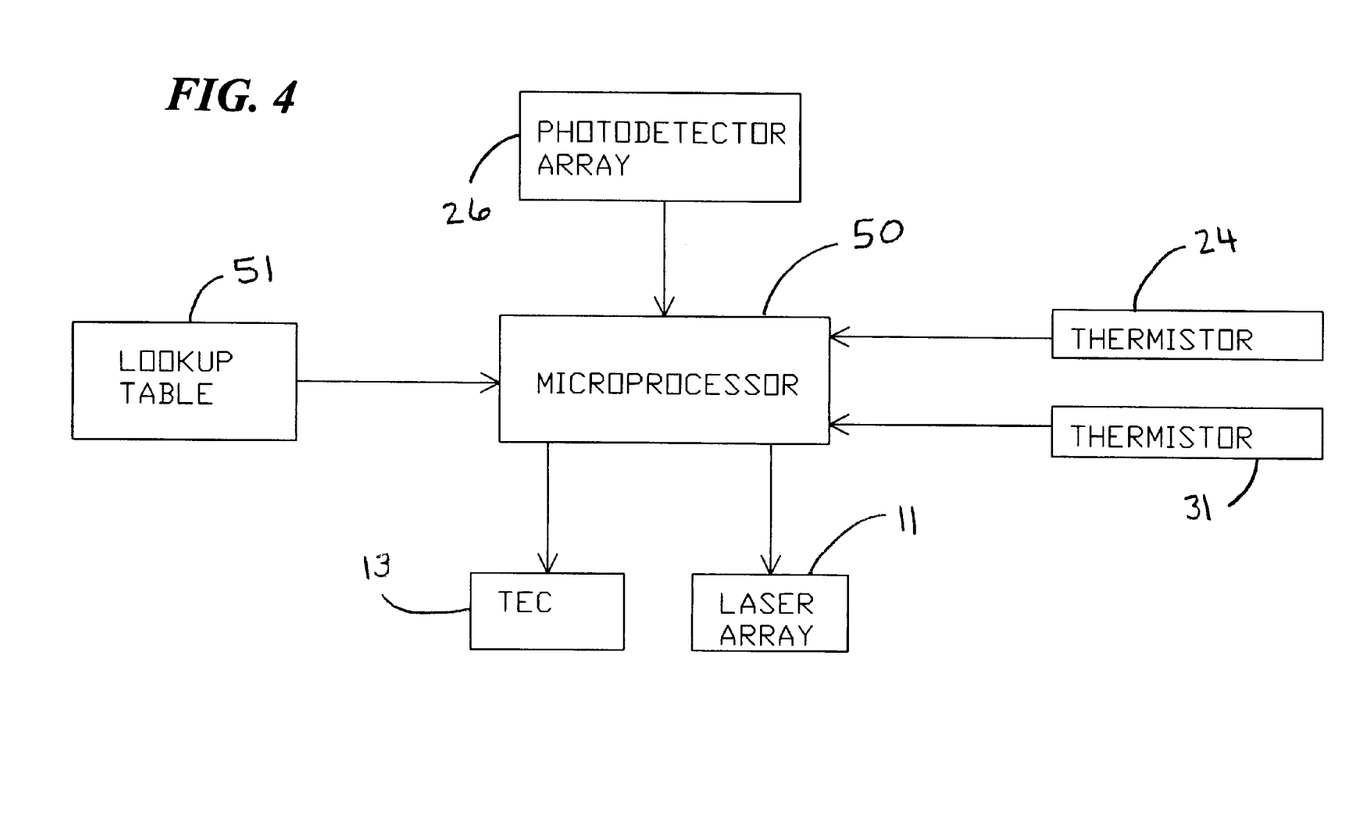
FIG. 4 is a semi-schematic block diagram showing interaction of a microprocessor with a peltier thermoelectric cooler (TEC), a laser, a first semiconductor laser or laser array thermistor, a second locker thermistor, a three-section photo-detector (array) assembly and a lookup table of semiconductor laser or laser array wavelength vs. temperatures.

Referring now to FIG. 4, the microprocessor 50 receives inputs from the multi-element photo detector or photodetector array 26, which is representative of the wavelength of light provided to the multiple-cavity phase shifted etalon 21. However, due to temperature changes of the multiple-cavity phase shifted etalon 21 caused by the TEC 13, as discussed above, an error may exist in the measured value of the wavelength of the semiconductor laser or laser array. The microprocessor 40 uses a lookup table 51, or otherwise calculates or determines the error value and thus determines the measured wavelength light provided to the multiple-cavity phase shifted etalon 21.

The microprocessor 50 provides a control signal to the thermoelectric cooler (typically via TEC controller circuitry which is not shown), so as to cause the thermoelectric cooler 13 to change the temperature of the selected semiconductor laser or laser array 11 in a manner which causes the wavelength output therefrom to move closer to the desired wavelength.

The microprocessor 40 uses the output of temperature sensor 24 (disposed upon or proximate the multiple-cavity phase shifted etalon 21), and temperature sensor 31 (disposed upon or proximate the semiconductor laser or laser array substrate 12, preferably proximate to the semiconductor laser or laser array 11), as well, to determine the value to be looked up utilizing a lookup Table 51.

Figure 2:
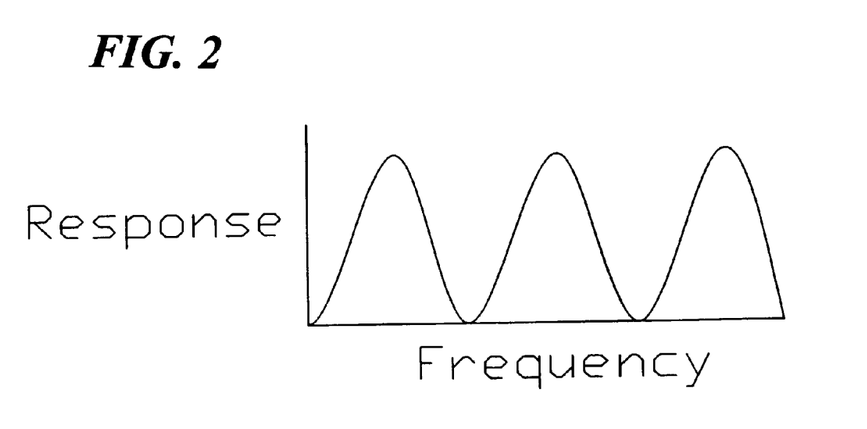
FIG. 2 is a chart showing a response of a single cavity etalon versus the frequency of light being monitored thereby.

Referring now to FIG. 2, the response versus frequency of a single-cavity etalon is shown. A single-cavity etalon provides a high response to wavelengths or frequencies, which correspond to physical length of the etalon. That is, a single-cavity etalon provides a response to wavelengths, which are equal to, or some multiple of the physical length of the etalon. Etalon may provide poor response at other wavelengths. Thus, dead spots or wavelength ranges of poor optical response are located intermediate wavelength ranges of good response. These dead spots prevent operation of a single-cavity etalon to provide wavelength measurement at such wavelengths.

Figure 3:
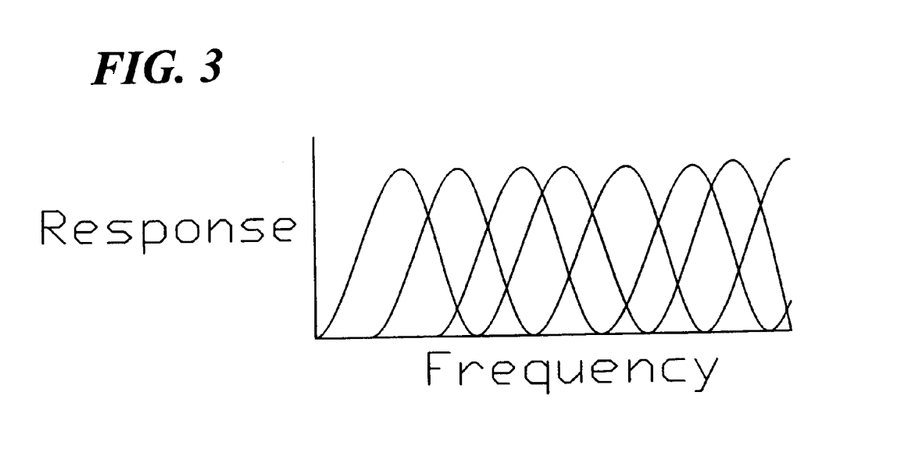
FIG. 3 is a chart showing a response of a three-cavity phase shifted (typically 120 degree angle apart) etalon versus the frequency of light being monitored thereby.

Referring now to FIG. 3, a response curve for a three-cavity phase shifted etalon is shown. The overlapping response curves caused by the use of three resonant cavities tends to fill-in the dead spots of the optical response curve of FIG. 2, thus providing a generally flatter total response curve at all wavelengths and temperatures. Thus, wavelengths over a much broader range may be accurately measured by the three-cavity phase shifted etalon. Adding additional phase cavities to such a multiple-cavity phase shifted etalon further tends to flatten the response curve thereof, and thus facilitate further enhanced measurement of wavelengths within a broad range, according to well-known principles.

By configuring, the components of the present invention in a folded configuration, wherein the multiple-cavity phase shifted etalon 21 is behind the laser 11, and wherein the semiconductor laser or laser array 11 outputs light only in the forward direction, enhanced efficiency in packaging is achieved. Thus, all of the components shown in FIGS. 1 and 2, with the exception of the external focusing lens 22 and fiber optic end 23, may be disposed within a standard hermetically sealed butterfly semiconductor laser or laser array package.

The semiconductor laser or laser array 11 may be either temperature or current or current & temperature tunable. With temperature tunable lasers, the TEC 13 directly controls the output wavelength thereof. With current tunable lasers, providing the necessary current controls the wavelength. With current and temperature tunable lasers, providing the necessary TEC current and bias currents control the wavelength.

It is understood that the exemplary wavelength locked semiconductor laser or laser array module described herein and shown in the drawings represents only presently preferred embodiment of the invention. Various modifications and additions may be made to section embodiment without departing from the spirit and scope of the invention. For example, those skilled in the art will appreciate that various different physical layouts of the components of the present invention are likewise suitable. Although a TEC is preferred, a resistive heater may alternatively be utilized for TEC. Thus, these and other modifications and additions may be obvious to those skilled in the art may be implemented to adapt to the present invention for use in a variety of applications.

What is claimed is:

1. A wavelength locked semiconductor laser module for fiber optic communications, the module comprising:
    a semiconductor laser substrate;
    an array of semiconductor lasers formed upon the semiconductor laser substrate;
    a TEC in thermal contact with the semiconductor laser substrate;
    a thermally conducting support/substrate in thermal contact with the TEC;
    a multiple-cavity phase shifted etalon in thermal contact with the thermally conducting support/substrate and configured to facilitate monitoring of a wavelength of light from at least one semiconductor laser of said array;
    a collimating lens receiving light from at least one semiconductor laser of said array;
    a first optical isolator receiving light from the collimating lens;
    a first mirror configured to reflect light from the first optical isolator upwardly;
    a second mirror configured to reflect light from the first mirror backwardly;
    a second optical isolator receiving light from the second mirror;
    a polarizing beam splitter receiving light from the second optical isolator;
    a quarter wave plate receiving light from the polarizing beam splitter and providing light to the etalon;
    a temperature sensor configured to measure a temperature representative of a temperature of the etalon; and
    a thermal jacket around the etalon to reduce the thermal gradient and increase thermal equilibrium time.

2. A wavelength locked semiconductor laser module for fiber optic communications, the module comprising:
    a semiconductor laser substrate;
    an array of semiconductor lasers formed upon the semiconductor laser substrate;
    a collimating lens receiving light from at least one semiconductor laser of said array;
    a first optical isolator receiving light from the collimating lens;
    a first mirror configured to reflect light from the first optical isolator upwardly;
    a second mirror configured to reflect light from the first mirror backwardly;
    a second optical isolator receiving light from the second mirror;
    a single multiple-cavity phase shifted etalon configured to receive light from said second optical isolator and facilitate a monitoring of a wavelength of light from at least one semiconductor laser of said array; and
    wherein the single multiple-cavity phase shifted etalon is disposed behind the laser array such that the wavelength locked semiconductor laser module is constructed in a vertical stacked configuration.

3. The wavelength locked semiconductor laser module according to claim 2, wherein the single multiple-cavity phase shifted etalon comprises a multiplicity of cavities circumferentially disposed about a common central axis and each cavity having a characteristic phase relationship with adjoining cavities.

4. The wavelength locked semiconductor laser module according to claim 3, wherein the single multiple-cavity phase shifted etalon comprises three cavities, each cavity having a characteristic phase shift such that the etalon exhibits a phase delay of 120 degree angle relative to each phase shift.

5. The wavelength locked semiconductor laser module according to claim 4, further comprising:
    a thermal jacket disposed about an outer circumferential surface of the etalon; and
    wherein the thermal jacket conducts heat substantially uniformly throughout the surface of the etalon, thereby reducing the thermal gradient across the etalon and substantially reducing the time required for the etalon to reach thermal equilibrium.

6. The wavelength locked semiconductor laser module according to claim 5, wherein the thermal jacket comprises a metal jacket in intimate contact with the outer circumferential surface of the etalon.

7. The wavelength locked semiconductor laser module according to claim 5, further comprising:
    a TEC in thermal contact with the semiconductor laser substrate;
    a thermally conducting support/substrate in thermal contact with the TEC; and
    wherein the single multiple-cavity phase shifted etalon is in thermal contact with the thermally conducting support/substrate and is coupled to the thermally conducting support/substrate by a eutectic solder so as to eliminate epoxy bonding.

8. The wavelength locked semiconductor laser module according to claim 7, wherein the thermal jacket comprises a metal jacket in intimate thermal contact with the outer circumferential surface of the etalon and in intimate thermal contact with the thermally conducting support/substrate.

9. The wavelength locked semiconductor laser module according to claim 3, further comprising:
    a multi-element detector array, configured to measure an optical response of the single multiple-cavity phase shifted etalon; and
    wherein the elements of the multi-element detector array are circumferentially disposed about a common central axis, each element spatially related to a corresponding one of the multiplicity of cavities of the multiple-cavity phase shifted etalon.

10. A wavelength locked semiconductor laser module for fiber optic communications, the module comprising:
   a semiconductor laser substrate;
   an array of semiconductor lasers formed upon the semiconductor laser substrate;
   a TEC in thermal contact with the semiconductor laser substrate;
   a thermally conducting support/substrate in thermal contact with the TEC;
   a collimating lens receiving light from at least one semiconductor laser of said array;
   a first optical isolator receiving light from the collimating lens;
   a first mirror configured to reflect light from the first optical isolator upwardly;
   a second mirror configured to reflect light from the first mirror backwardly;
   a second optical isolator receiving light from the second mirror;
   a single multiple-cavity phase shifted etalon configured to receive light from said second optical isolator and facilitate monitoring of a wavelength of light from at least one semiconductor laser of said array, the etalon being in thermal contact with the thermally conducting support/substrate; and
   wherein the single multiple-cavity phase shifted etalon is coupled to the thermally conducting support/substrate by a eutectic solder so as to eliminate epoxy bonding.

11. The wavelength locked semiconductor laser module according to claim 10, wherein each of the elements of the module are disposed within a standard hermetically sealed butterfly semiconductor laser or laser array package, at least the semiconductor laser array, semiconductor substrate, TEC, thermally conducting support/substrate and the single multiple-cavity phase shifted etalon bonded together by a eutectic solder so as to eliminate epoxy bonding.

12. The wavelength locked semiconductor laser module according to claim 11, wherein the eutectic solder comprises indium/tin solder.

13. The wavelength locked semiconductor laser module according to claim 11, wherein the single multiple-cavity phase shifted etalon is disposed behind the laser array such that the wavelength locked semiconductor laser module is constructed in a vertical stacked configuration.

14. A wavelength locked semiconductor laser module for fiber optic communications, the module comprising:
   a semiconductor laser substrate;
   an array of semiconductor lasers formed upon the semiconductor laser substrate;
   a collimating lens receiving light from at least one semiconductor laser of said array;
   a first optical isolator receiving light from the collimating lens;
   a first mirror configured to reflect light from the first optical isolator upwardly;
   a second mirror configured to reflect light from the first mirror backwardly;
   a second optical isolator receiving light from the second mirror;
   a single, multiple-cavity phase shifted etalon configured to receive light from said second optical isolator and facilitate monitoring of a wavelength of light from at least one semiconductor laser of said array; and
   wherein the single multiple-cavity phase shifted etalon comprises three cavities, each cavity having a characteristic phase shift such that the etalon exhibits a phase delay of 120 degree angle relative to each phase shift.

15. The wavelength locked semiconductor laser module according to claim 14, further comprising:
   a semiconductor laser substrate temperature sensor;
   an etalon temperature sensor configured to measure a temperature representative of a temperature of the etalon;
   a TEC in thermal contact with the semiconductor laser substrate; and
   a thermally conducting support/substrate in thermal contact with the TEC.

16. The wavelength locked semiconductor laser module according to claim 15, further comprising:
   a thermal jacket disposed about an outer circumferential surface of the etalon and in thermal contact with the thermally conducting support/substrate; and
   wherein the thermal jacket conducts heat substantially uniformly throughout the surface of the etalon, thereby reducing the thermal gradient across the etalon and substantially reducing the time required for the etalon to reach thermal equilibrium.

17. The wavelength locked semiconductor laser module according to claim 16, further comprising:
   a multi-element detector array, configured to measure an optical response of the single multiple-cavity phase shifted etalon; and
   wherein the elements of the multi-element detector array are circumferentially disposed about a common central axis, each element spatially related to a corresponding one of the cavities of the single multiple-cavity phase shifted etalon.

18. The wavelength locked semiconductor laser module according to claim 17, further comprising:
   a microprocessor coupled to provide control signals to the TEC, receive at least semiconductor laser substrate temperature sensor signals, and receive detector signals from the multi-element detector array corresponding to an optical response of the single multiple-cavity phase shifted etalon; and
   a look-up table, accessible by the microprocessor, the look-up table containing values representing a correlation between at least a detected laser output wavelength and a measured semiconductor laser substrate temperature.

19. The wavelength locked semiconductor laser module according to claim 17, the look-up table further including a set of error offset values corresponding to an error offset of a measured wavelength by the single multiple-cavity phase shifted etalon, the error offset induced by a thermally generated dimension change of the single multiple-cavity phase shifted etalon.

* * * * *